(12) United States Patent
Kohno

(10) Patent No.: US 6,347,047 B2
(45) Date of Patent: Feb. 12, 2002

(54) MASK ROM SEMICONDUCTOR MEMORY DEVICE CAPABLE OF SYNCHRONIZING THE ACTIVATION OF THE SENSE AMPLIFIER AND OF THE WORD LINE

(75) Inventor: Takaki Kohno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/878,379

(22) Filed: Jun. 12, 2001

(30) Foreign Application Priority Data

Jun. 12, 2000 (JP) ........................................ 2000-174817

(51) Int. Cl.$^7$ .............................................. G11C 17/12
(52) U.S. Cl. ........................ 365/104; 365/103; 365/94; 365/196; 365/195; 365/194; 365/189.05; 365/210
(58) Field of Search .......................... 365/94, 103, 104, 365/191, 195, 196, 194, 189.05, 208, 210

(56) References Cited

U.S. PATENT DOCUMENTS 5,962,900 A * 10/1999 Chou et al. ................. 257/368

FOREIGN PATENT DOCUMENTS

| JP | 4-311900 | 11/1992 | ........... G11C/17/18 |
| JP | 9-265791 | 10/1997 | ........... G11C/16/06 |

* cited by examiner

*Primary Examiner*—Andrew Q. Tran
(74) *Attorney, Agent, or Firm*—Young & Thompson

(57) ABSTRACT

A semiconductor memory device is provided with a memory cell array, a sense circuit which activates main bit lines in the memory cell array, a buffer which generates an activating signal which activates the sense circuit from a control signal, an address designating section which selects a memory cell indicated by an address signal among a plurality of memory cells in the memory cell array, and a delay circuit which delays the activating signal and outputting it to the sense circuit. The address designating section activates a word line to which a memory cell indicated by the address signal is connected after some delay from the activation of a chip enable signal.

13 Claims, 22 Drawing Sheets

209 (SENSE CIRCUIT)

208 (CHARGE CIRCUIT)

209R (REFERENCE CIRCUIT)

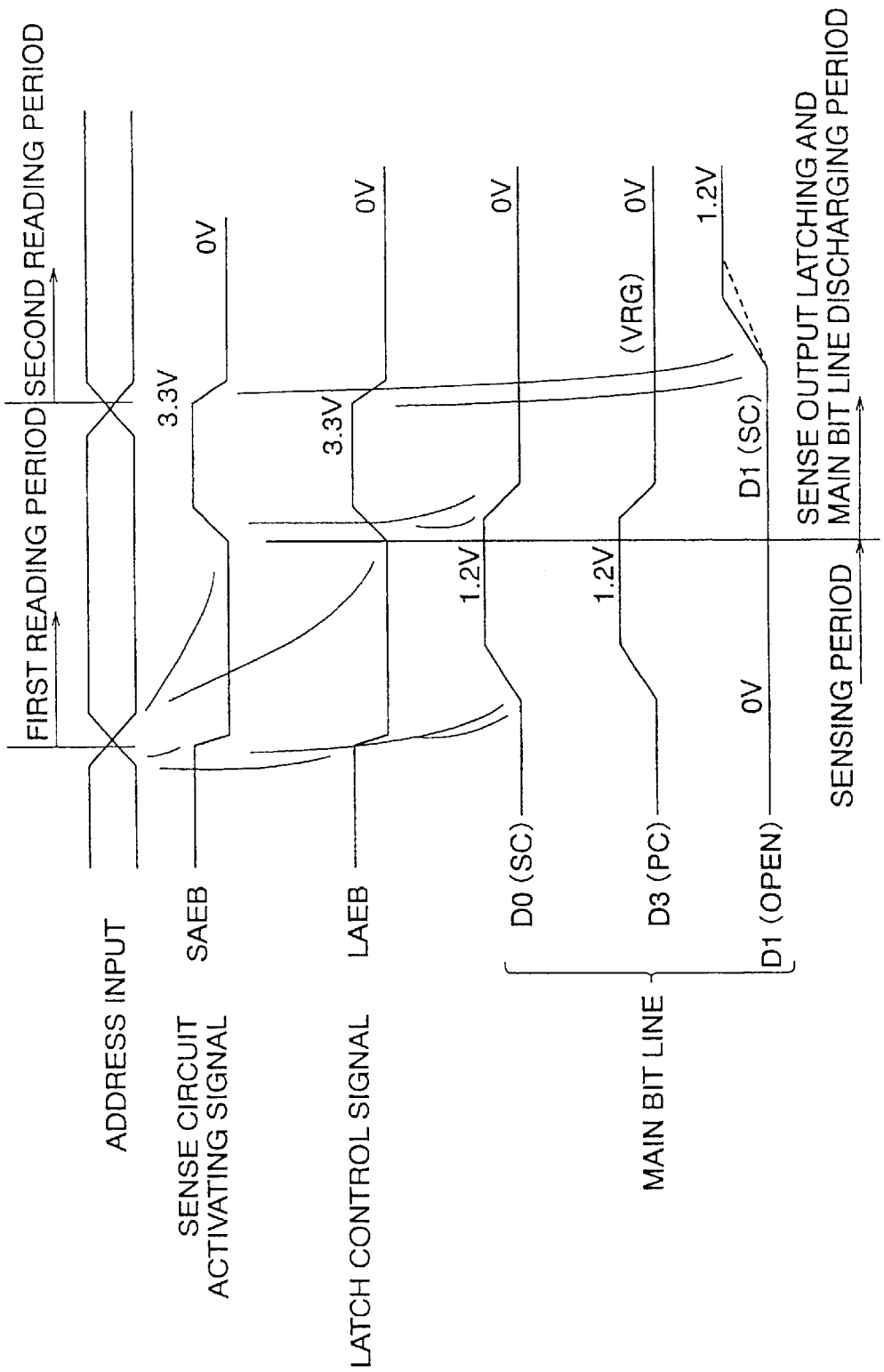

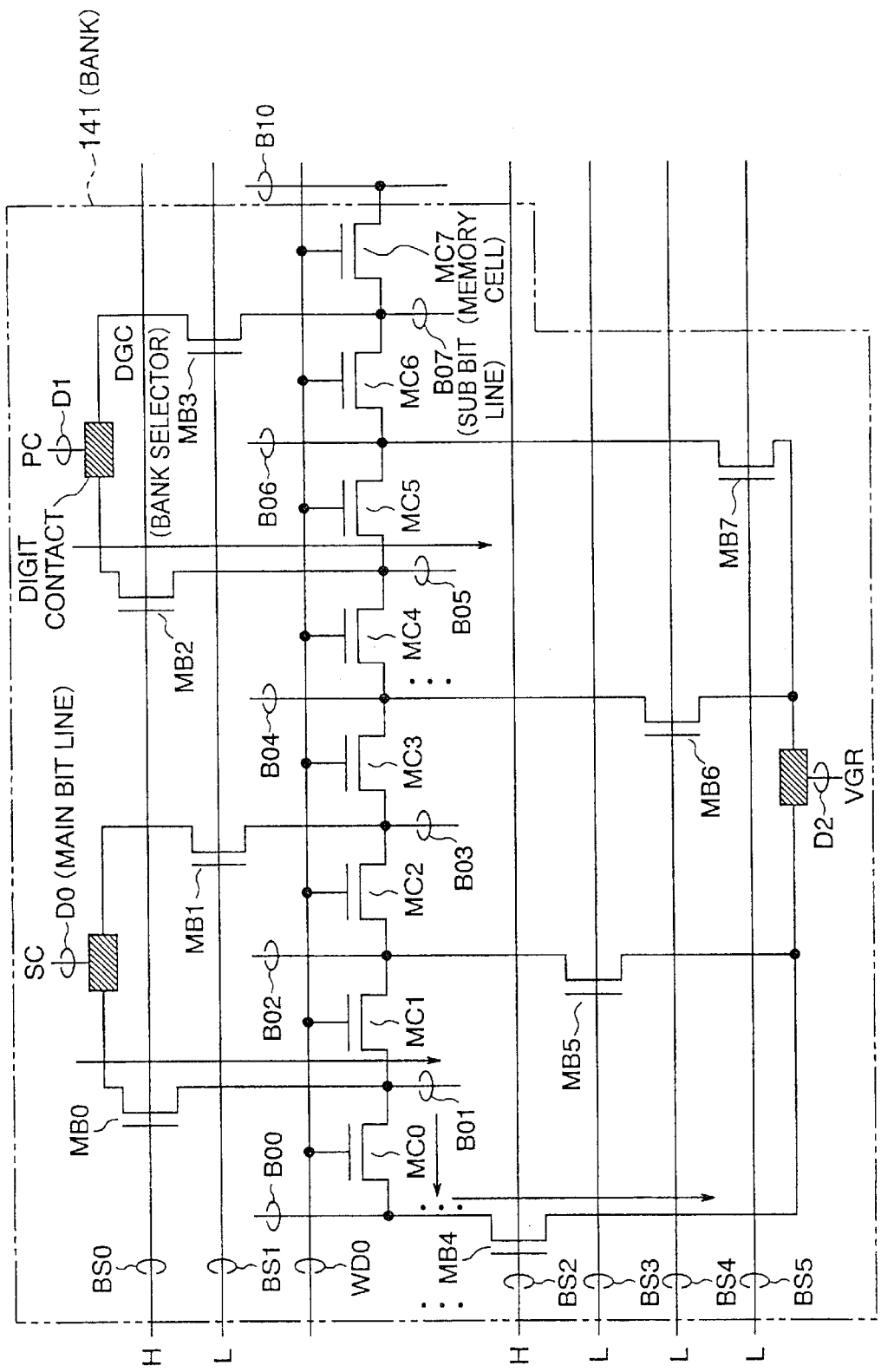

MASK ROM SEMICONDUCTOR MEMORY DEVICE CAPABLE OF SYNCHRONIZING THE ACTIVATION OF THE SENSE AMPLIFIER AND OF THE WORD LINE

BACKGROUND OF THE INVENTION

1. Field of the Invention

The present invention relates to a semiconductor read only memory device such as a mask ROM which employs flat type memory cells, and more particularly to a semiconductor memory device which is intended to inhibit a voltage drop of main bit lines.

2. Description of the Related Art

FIG. 1 is a block diagram showing a conventional semiconductor memory device.

The conventional semiconductor memory device shown in FIG. 1 is a mask ROM employing flat type memory cells. A plurality of sub-bit lines and a plurality of word lines are arranged to be perpendicularly intersected each other. Each of intersections thereof is provided with one memory cell. Every two sub-bit lines are connected to one main bit line, while one sub-bit line following the every two sub-bit lines skips. In this manner, a memory cell array 111 is constructed. Also, an address designating section (not shown) is provided to select a specific memory cell via main bit lines, sub-bit lines and word lines. The address designating section is provided with an address buffer 102, a Y decoder 104, a bank decoder 105, a word decoder 106, a virtual GND decoder 107, a Y selector 110, a virtual GND selector 112 and the like. Furthermore, the conventional semiconductor memory device is provided with a data output section, which outputs a signal in response to data stored in the memory cell selected by the address designating section. The data output section includes a sense circuit 109, an output buffer 113, a charge circuit 108 and the like.

The conventional semiconductor memory device constructed as explained in the above has characteristics that the main bit line, the sub-bit line and the word line become active by a control signal, and the word line become active after a predetermined time is passed after the main bit lines and the sub-bit lines are active at the same time. This is because very large number of gate capacities is connected to the word lines as compared to the main bit lines and the sub-bit lines. For example, such a semiconductor memory device is disclosed in Japanese Patent Laid-Open Nos. hei 4-311900 and hei 9-265791.

However, the conventional semiconductor memory device cannot operate at a sufficiently high speed, since it includes several defects as follows:

Because a large number of gate capacities is connected to the word lines, delay time thereof is long. Due to this, there may be a malfunction either if an ON bit memory cell is selected or if an OFF bit memory cell is selected.

FIG. 2 is a timing chart showing the operations of the conventional semiconductor memory device shown in FIG. 1. For example, if the ON bit memory cell is selected, the main bit line (node SC) is charged due to the activation of the sense circuit 109 and the Y selector 110. However, because the delay time of word lines (word line decoding signal WD) is long, the main bit line (node SC) will be charged to the high level. As a result, though the expected value (true value) of the main bit line (node SC) is set to the low level when the ON bit memory cell is selected, a differential amplifier incorporated in the sense circuit 109 malfunctions and thereby outputs the high level in a first malfunction period.

FIG. 3 is a circuit diagram showing banks present in the conventional semiconductor memory device shown in FIG. 1. For example, it is assumed that memory cells MC0 and MC3 are OFF bits and memory cells MC1 and MC2 are ON bits. And, when the OFF bit memory cell MC0 is selected, the main bit line D0 is charged to the high level. In this case, because the word line WD0 is activated, the memory cells MC1 and MC2, which are adjacent to the memory cell MC0 also become conductive state. As a result, current also flows through sub-bit lines B02 and B03 which are set to the GND level, as indicated by arrows. Therefore, the voltage of the main bit line D0 is transiently dropped in a second malfunction period.

The capacity of the sub-bit lines B02 and B03 is as minute as 100 fF per each at most. However, because the sensitivity of the sense circuit 109 is high, even though the expected value is in the high level, it is detected as the low level (false data) due to the voltage drop. Therefore, surplus delay time in returning to the true data is generated.

Strictly, the existence of the malfunctions at the time when selecting an ON bit memory cell and at the time when selecting an OFF bit memory cell depends on the design technique of reference level VRA. However, in FIG. 2, the fact that the main bit line (node SC) has been set to the state of false data (in a first malfunction period) and is to be turned to the false data (in a second malfunction period) forms a problem, in themselves.

And, in view of noise margin in the design, frequent level variations (e.g., from high level to low level, and then to high level) of the main bit line (node SC) are not desired. Furthermore, it is not easy to highly increase the speed of word line decoding signal WD, because it is contrary to the high integration.

Additionally, there are cases that the main bit line (node SC) is connected to the charge circuit 109, and the main bit line (node SC) is connected to the virtual GND line VRG, in response to a selected address. For this reason, if reading is repeated plural times, the initial value of the main bit line (node SC) becomes indefinite.

FIG. 4 is a timing chart showing the operation of the conventional semiconductor memory device shown in FIG. 1. It is assumed that the memory cell MC0 is selected in a first reading period and the memory cell MC4 is selected in a second reading period. In this case, a main bit line D3 is charged in the first reading period and discharged in the second reading period. The main bit line selected in the second reading period is a main bit line D1. Because the main bit line D3 and the main bit line D1 adjoin each other, a coupling capacitance exists therebetween. And, signals flowing in these main bit lines are opposite phases each other. Therefore, crosstalk, which increases delay time, is generated.

With reference to FIG. 3, the necessity of the charge circuit 108 is explained. It is assumed that the selected memory cell MC0 is OFF bit and memory cells MC1 to MC7 are ON bits. In this case, if the memory cell MC0 is selected, non-selected memory cells MC1 to MC7 become conductive state. For this reason, sub-bit lines B04 to B10 are charged. As a result, the voltage of node SC of main bit line D0 (the expected value of which is high level) will be dropped and the reading speed will be decreased. In order to prevent this, the charge circuit 108 applies a voltage to the node PC.

SUMMARY OF THE INVENTION

It is the object of the present invention to provide a semiconductor memory device that can inhibit a voltage drop of main bit lines when data is read or when sub-bit lines are charged.

According to one aspect of the present invention, a semiconductor memory device comprises a memory cell array. The memory cell array has a plurality of main bit lines and a plurality of word lines that are perpendicularly intersected each other, and a plurality of memory cells provided at each of intersections between the main bit lines and word lines one by one. The semiconductor memory device further comprises a sense circuit which activates the main bit lines, a buffer which generates an activating signal which activates the sense circuit from a control signal, an address designating section which selects a memory cell indicated by an address signal among the plurality of memory cells, and a delay circuit which delays the activating signal and outputting it to the sense circuit. The address designating section activates a word line to which a memory cell indicated by the address signal is connected after some delay from the activation of a chip enable signal.

According to another aspect of the present invention, a semiconductor memory device comprises a memory cell array. The memory cell array has a plurality of sub-bit lines and a plurality of word lines that are perpendicularly intersected each other, a plurality of memory cells provided at each of intersections between the sub-bit lines and word lines one by one, and a plurality of main bit lines to each of which two sub-bit lines among the plurality of sub-bit lines are commonly connected, one bit line being disposed between the two sub-bit lines. The semiconductor memory device further comprises a sense circuit which activates the main bit lines, a buffer which generates an activating signal which activates the sense circuit from a control signal, an address designating section which selects a memory cell indicated by an address signal among the plurality of memory cells, and a delay circuit which delays the activating signal and outputting it to the sense circuit. The address designating section activates a word line to which a memory cell indicated by the address signal is connected after some delay from the activation of a chip enable signal.

According to the present invention, the timing for activating the sense circuit approaches to the timing for activating the word line by the delay circuit. As a result, the voltage drop of the main bit lines generated at the time of reading the memory cells or charging the sub-bit lines can be inhibited. Therefore, extension of noise margin and improvement in sense speed can be achieved.

In addition, when an ON bit memory cell is selected, i.e., when the expected value of a main bit line is the low level, it is prevented to detect the main bit line as the high level before the word lines are activated. Furthermore, when an OFF bit memory cell is selected, i.e., when the expected value of a main bit line is the high level, it is prevented to detect the main bit line as the low level directly after the word lines are activated. Therefore, switching current (consuming current) due to malfunction can be reduced.

Also, if the output node of charge circuit is read and reset to the GND level at each cycle, crosstalk between main bit lines is reduced.

BRIEF DESCRIPTION OF THE DRAWINGS

The above objects, other objects, features and advantages of the present invention will be better understood from the following description taken in conjunction with the accompanying drawings, in which:

FIG. 14 is a timing chart showing the operation of the semiconductor memory device according to the second embodiment of the present invention;

FIG. 22 is a circuit diagram showing banks applicable to the present invention.

DETAILED DESCRIPTION OF THE PREFERRED EMBODIMENT

Figure 1:
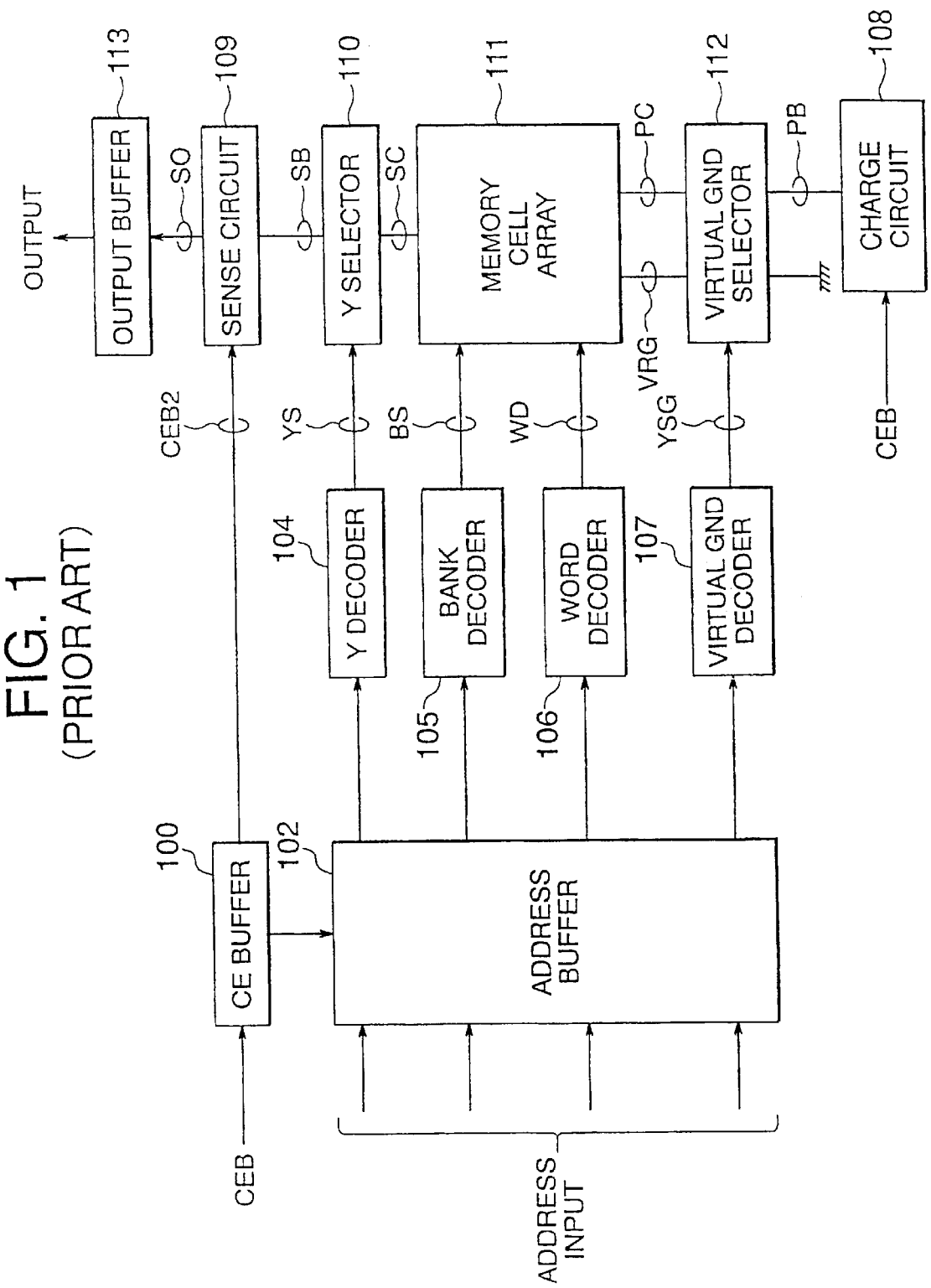
FIG. 1 is a block diagram showing a conventional semiconductor memory device.
Figure 2:
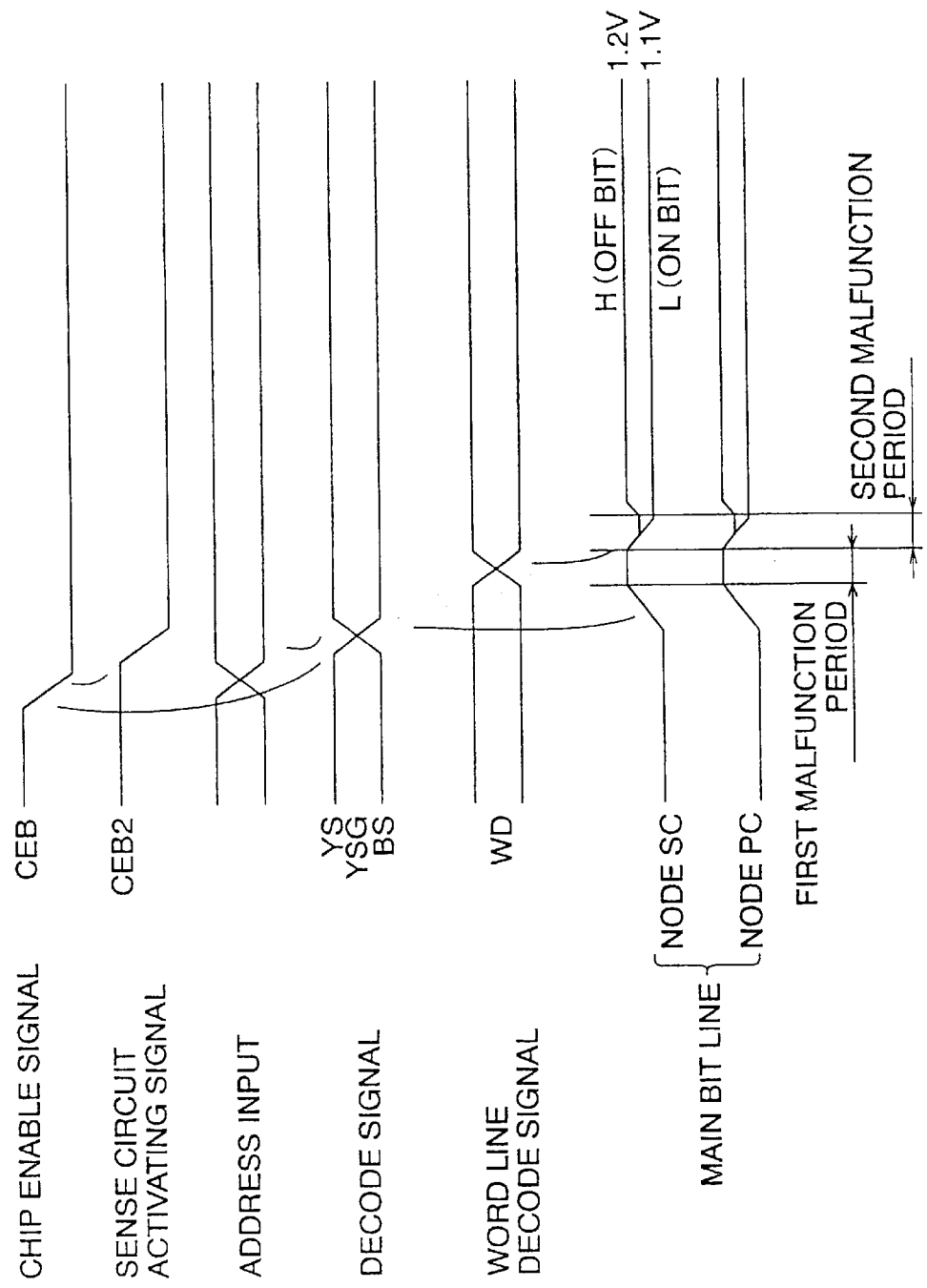
FIG. 2 is a timing chart showing the operation of the conventional semiconductor memory device shown in FIG. 1.
Figure 3:
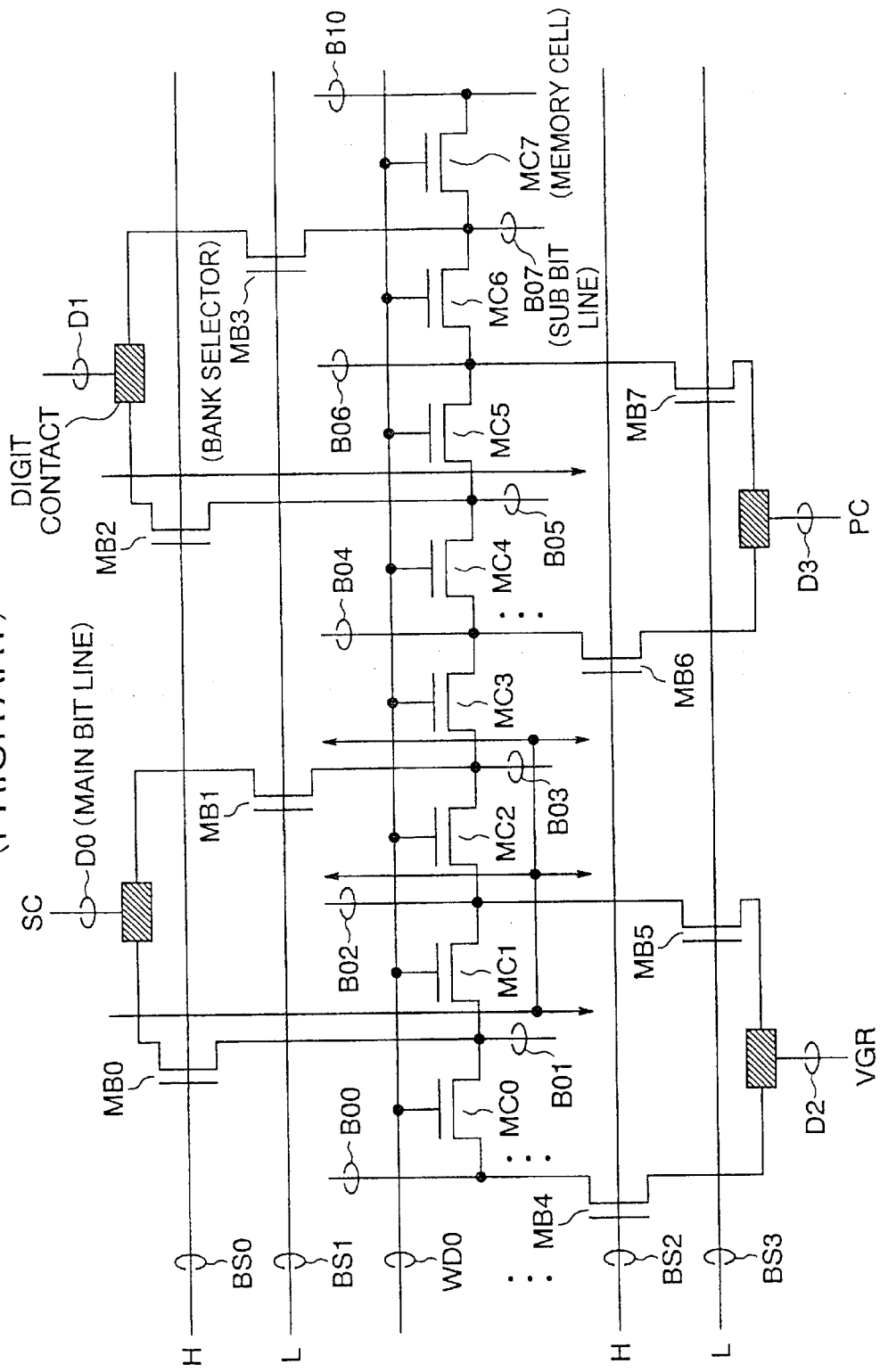
FIG. 3 is a circuit diagram showing banks in the conventional semiconductor memory device shown in FIG. 1.
Figure 4:
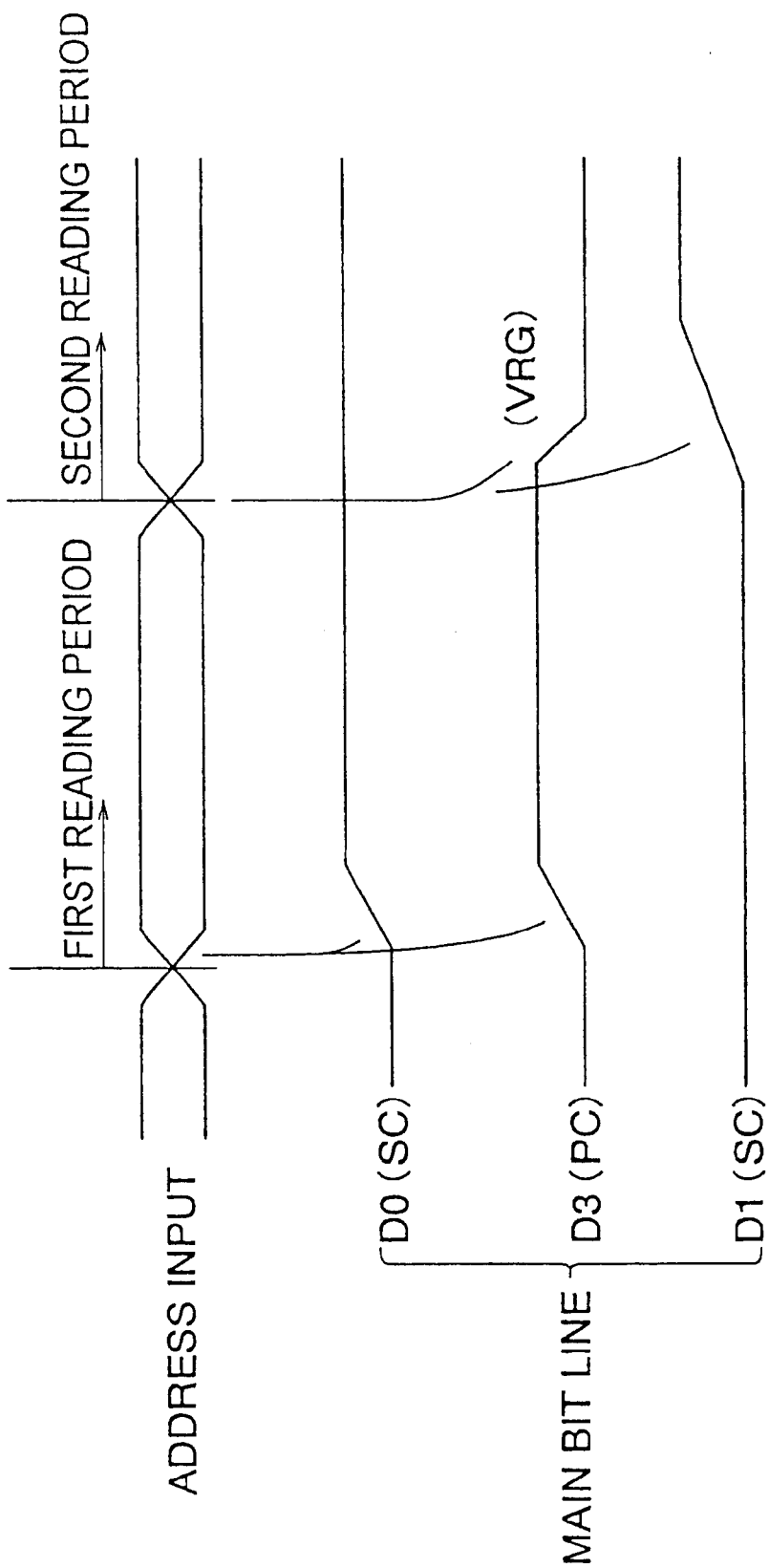
FIG. 4 is another timing chart showing the operation of the conventional semiconductor memory device shown in FIG. 1.
Figure 5:
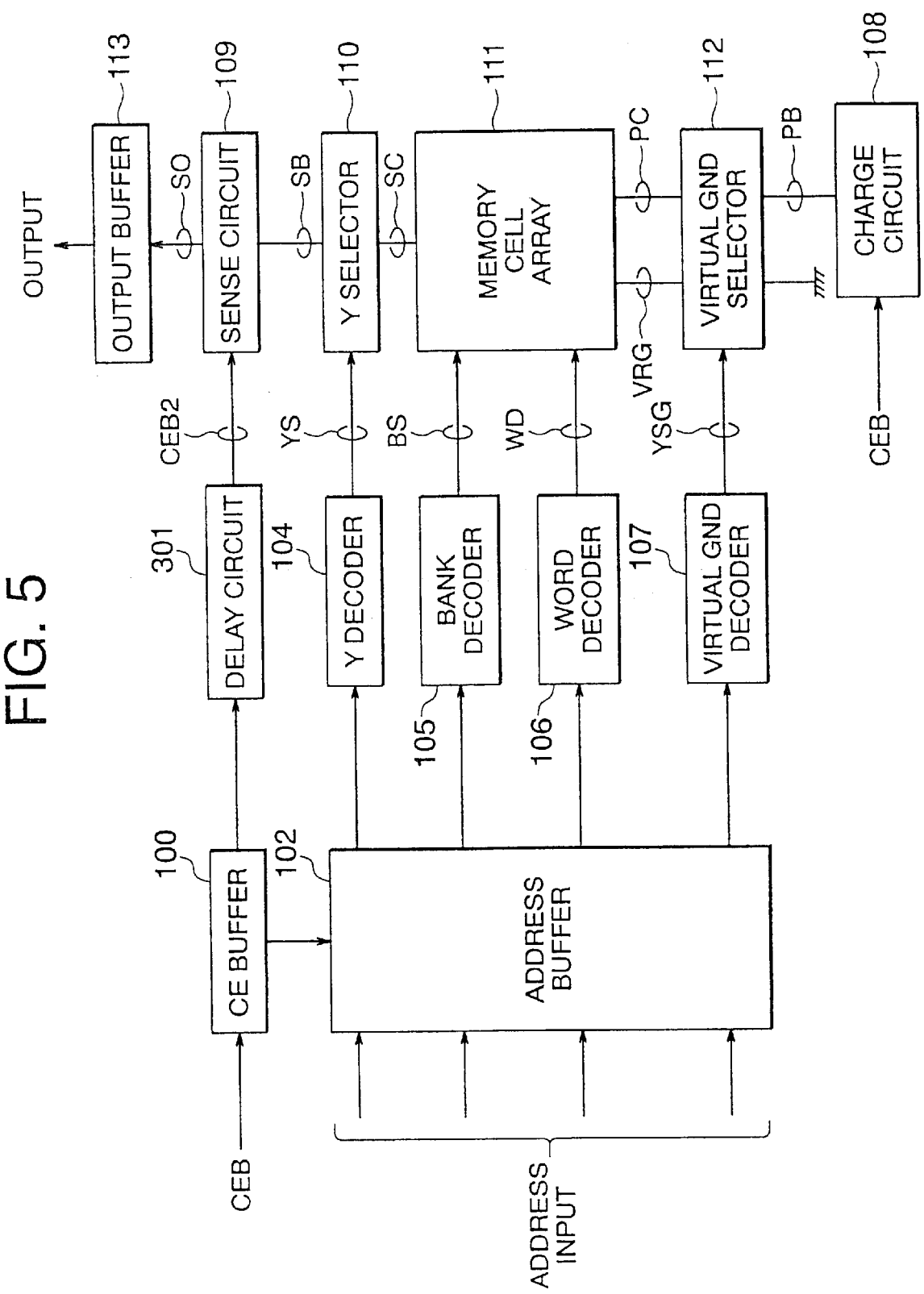
FIG. 5 is a block diagram showing the semiconductor memory device according to a first embodiment of the present invention.

Now, preferred embodiments of the present invention will be described below in detail with reference to the attached drawings. FIG. 5 is a block diagram showing a semiconductor memory device according to a first embodiment of the present invention.

The first embodiment is provided with a CE buffer 100, an address buffer 102, a delay circuit 301, a Y decoder 104, a bank decoder 105, a word decoder 106, a virtual GND decoder 107, a charge circuit (main charge circuit) 108, a sense circuit 109, a Y selector 110, a memory cell array 111, a virtual GND selector 112, and an output buffer 113.

Figure 6A:
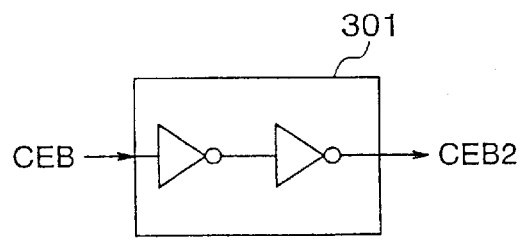
FIGS. 6A to 6D are circuit diagrams showing constructions of delay circuits 301 in the first embodiment.
Figure 6B:
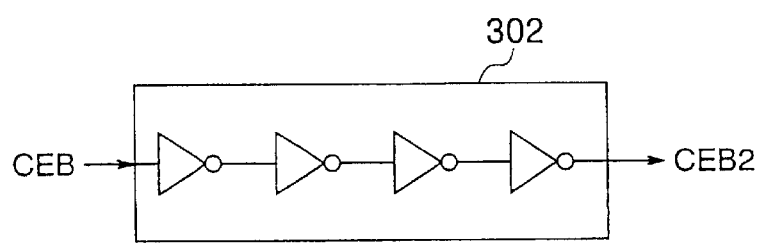
Figure 6C:
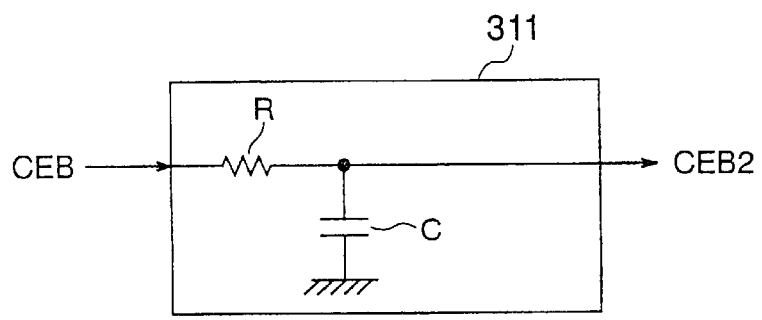
Figure 6D:
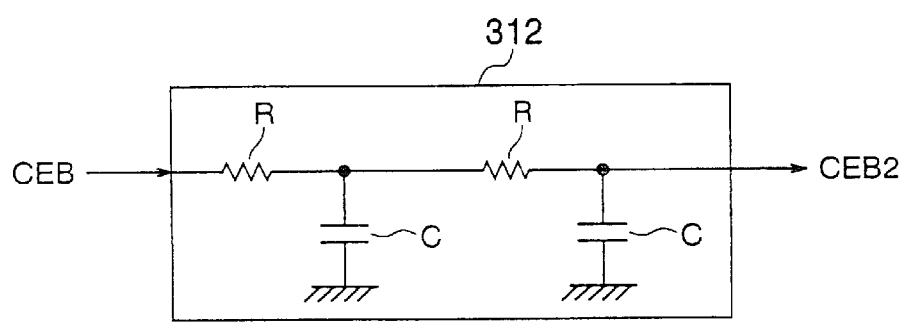

FIGS. 6A to 6D are circuit diagrams showing construction of a delay circuit 301 in the first embodiment. The delay circuit 301 consists of, for example, two inverters which are serially connected each other, as shown in FIG. 6A. Instead of the delay circuit 301, delay circuits 302, 311, 312 shown in FIGS. 6B to 6D may be used. The delay circuit 302 consists of, for example, four inverters which are serially connected each other, as shown in FIG. 6B. The delay circuit 311 consists of, for example, one CR integrating circuit, as shown in FIG. 6C. The delay circuit 312 consists of, for example, two CR integrating circuits which are directly connected each other as shown in FIG. 6D.

In general, when inverters are applied to an amplifying circuit, the dimension of rear stage is designed about four times as large as that of front stage among two continuous stages. Whereas, when inverters are applied to a delay circuit, the dimensions are designed to be substantially identical between two continuous stages. Furthermore, in the delay circuits 311 and 312, it is possible to use, for example, a polysilicon resistor as a resistor R and to use, for example, a gate capacity of a transistor as a capacity C.

Figure 7:
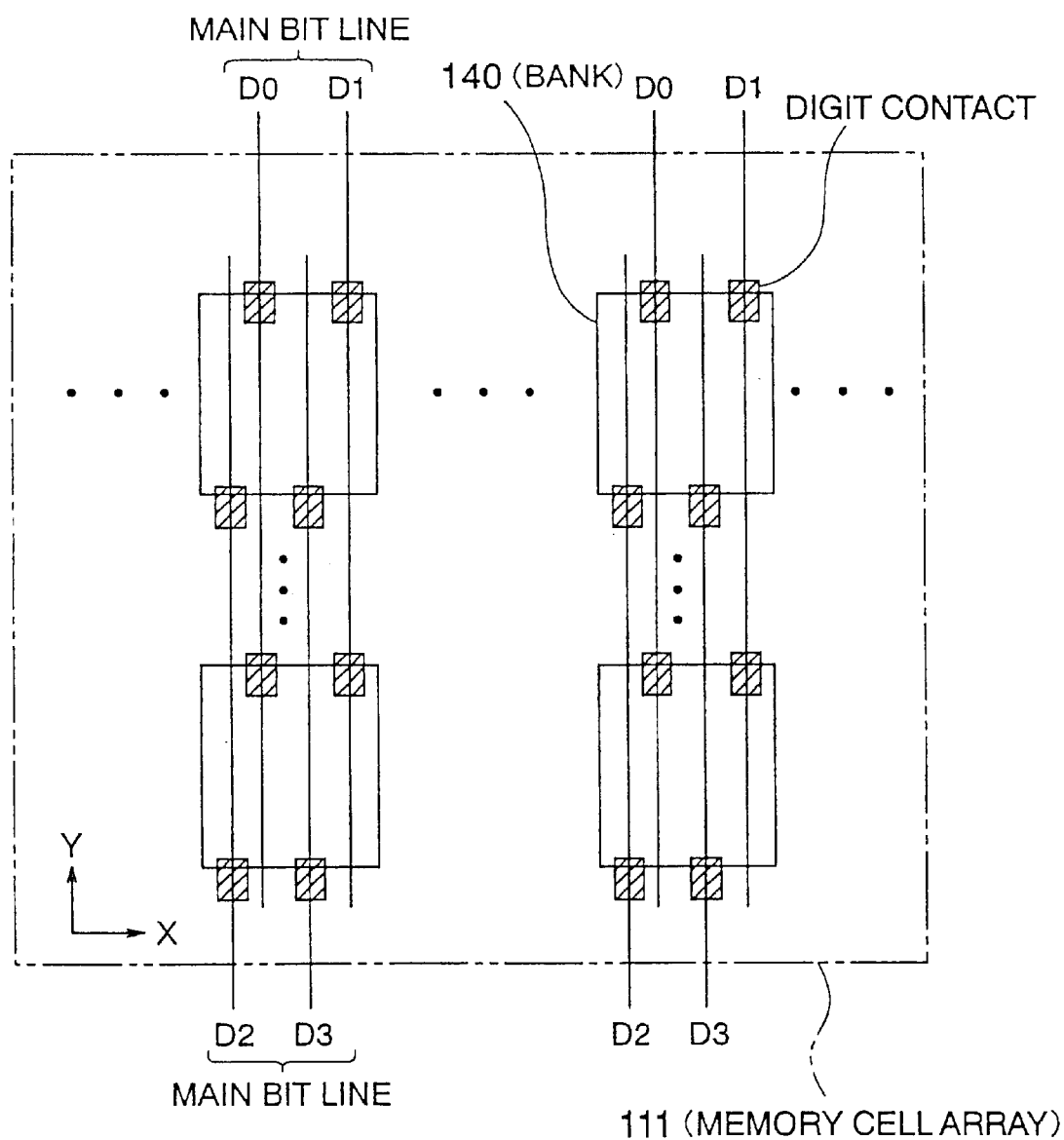
FIG. 7 is a block diagram showing a memory cell array 111 in the first embodiment.
Figure 8:
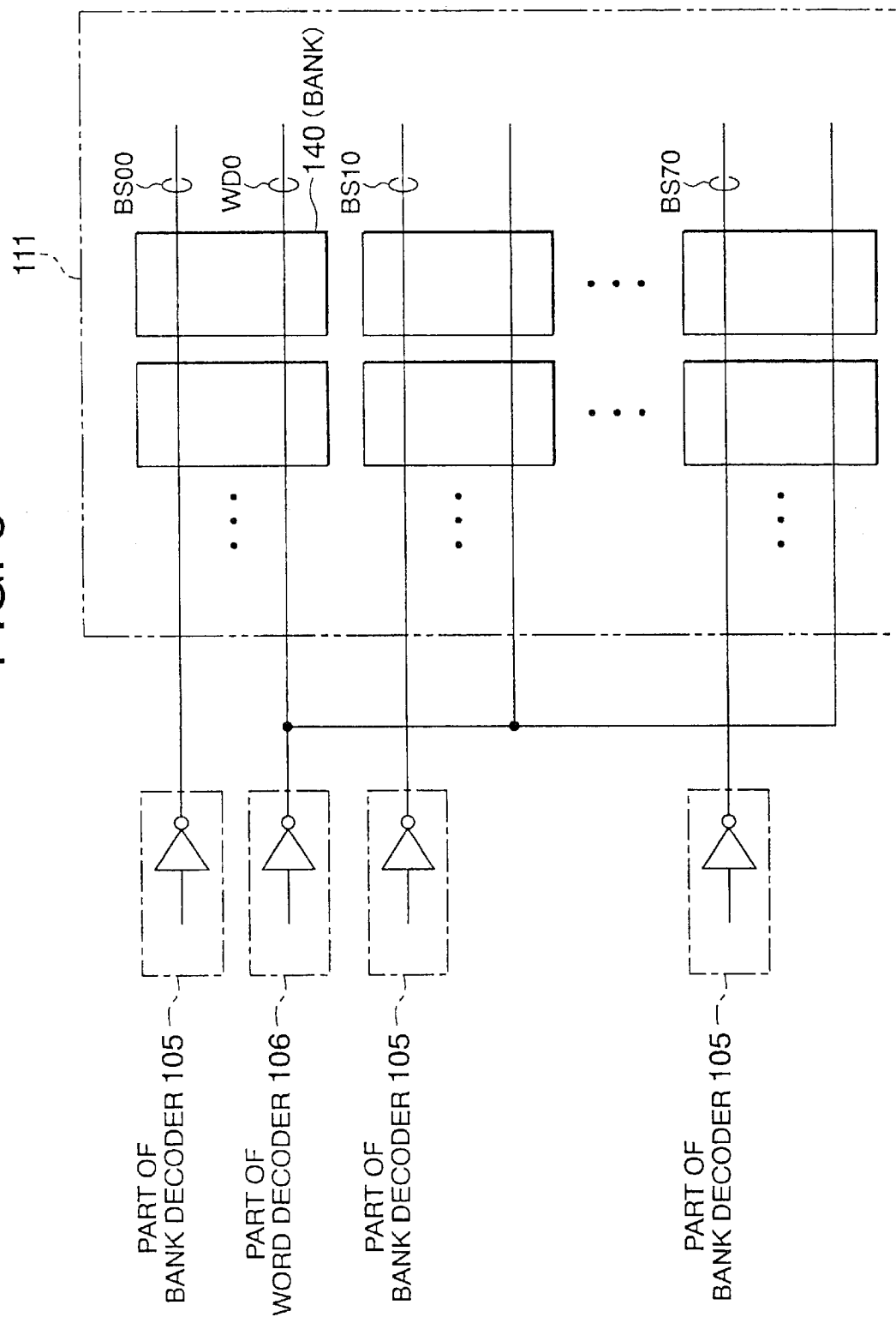
FIG. 8 is another block diagram showing a memory cell array 111 in the first embodiment.

FIGS. 7 and 8 are block diagrams showing the memory cell array in the first embodiment. As shown in FIG. 7, the memory cell array 111 is provided with a plurality of banks 140 arranged in a matrix form. In addition, main bit lines D0 to D3 are regularly and repeatedly arranged. Furthermore, as shown in FIG. 8, the bank decoder 105 drives one of bank select lines BS00 or the like, while the word decoder 106 drives a plurality of word lines WD0 or the like, for example, eight word lines. This is a well-known technique adopted for the high integration of the word decoder 106.

Figure 9:
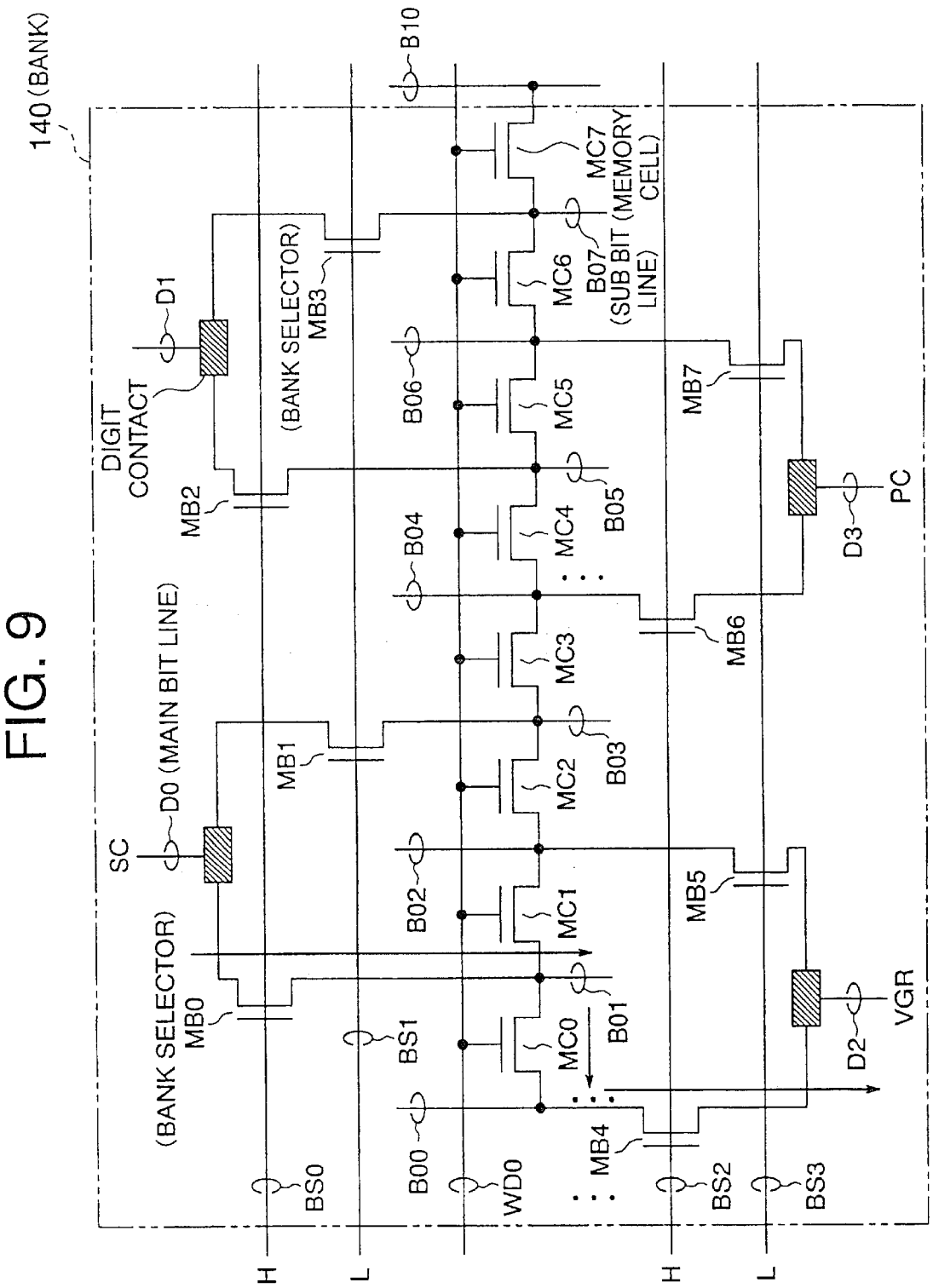
FIG. 9 is a circuit diagram showing banks shown in FIGS. 7 and 8.

FIG. 9 is a circuit diagram showing banks in FIGS. 7 and 8. Memory cells MC0 to MC7 consist of, for example, N-type enhancement transistors and are assigned with threshold value of low level (e.g., 1 V) or high level (e.g., 5 V) in accordance with a user's request. A memory cell of which the threshold value is the low level, is called as "ON bit" because it becomes conductive state when selected, while a memory cell of which the threshold value is the high level, is called as "OFF bit" because it becomes non-conductive state when selected. Bank selectors MB0 to MB7 consist of, for example, N-type enhancement transistors and all of their threshold values are fixed to the low level (e.g., 1 V). For clarity, one row of the memory cells MC0 to MC7 is shown and described in FIG. 9 and in the following description. In fact, between the bank selector MB1 and the bank selector MB2, for example, memory cells having 32 rows or 64 rows may be arranged. In addition, the main bit lines D0 to D3 consist of, for example, metal wiring and the sub-bit lines B01 to B07 consist of, for example, buried diffusion layers.

Figure 10A:
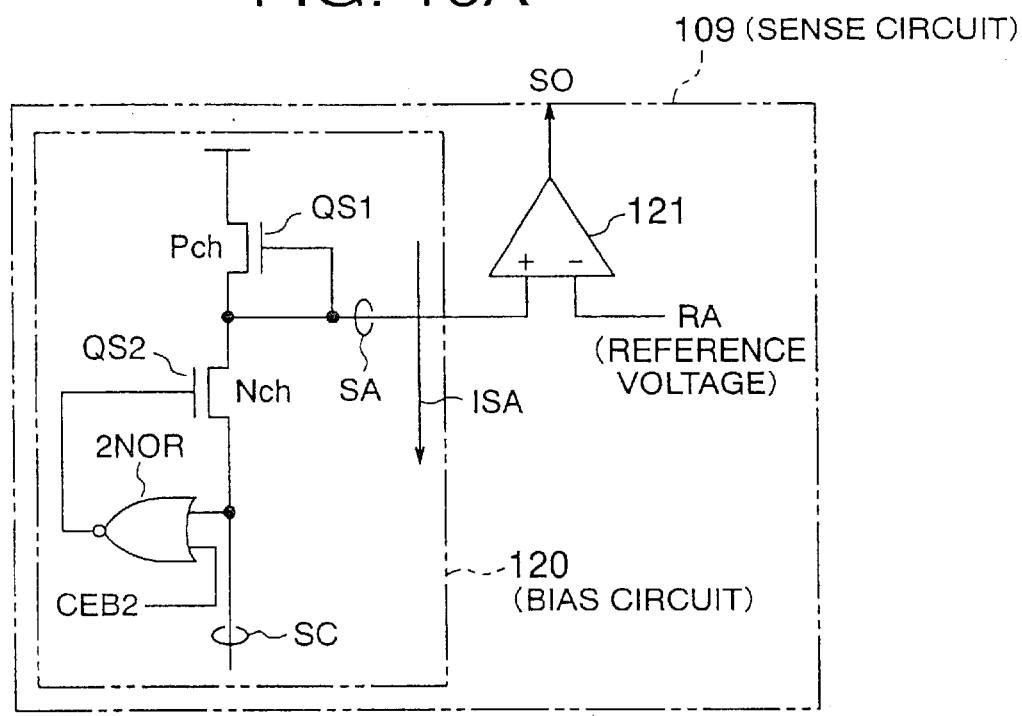
FIGS. 10A to 10C are block diagrams showing a series of sense circuits in the first embodiment.
Figure 10B:
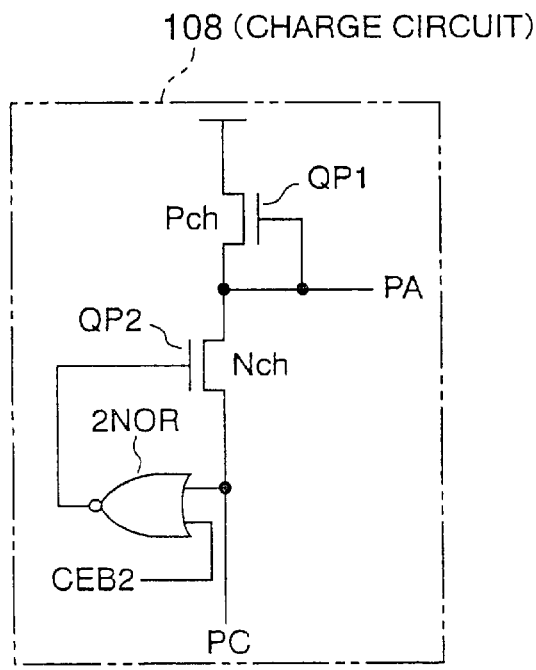
Figure 10C:
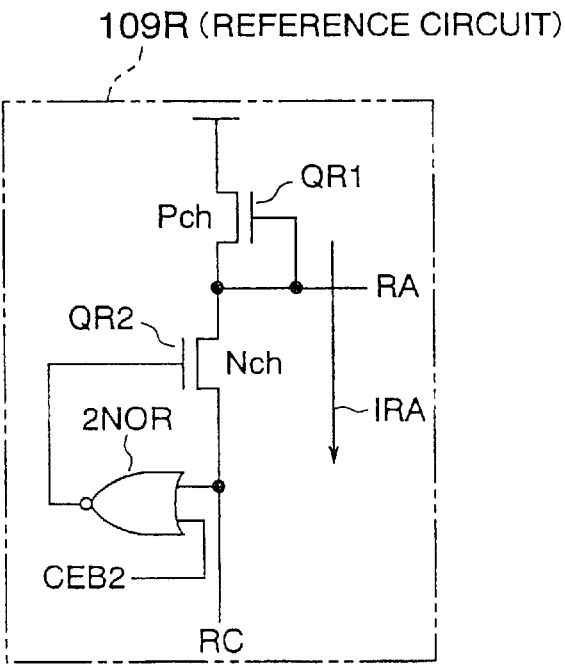

FIGS. 10A to 10C are block diagrams showing a series of sense circuits according to the first embodiment. The sense circuit 109 consists of, for example, a bias circuit 120 and a differential amplifying circuit 121 as shown in FIG. 10A. Both of the charge circuit 108 and the reference circuit 109R are identical or similar to the bias circuit 120.

Figure 11:
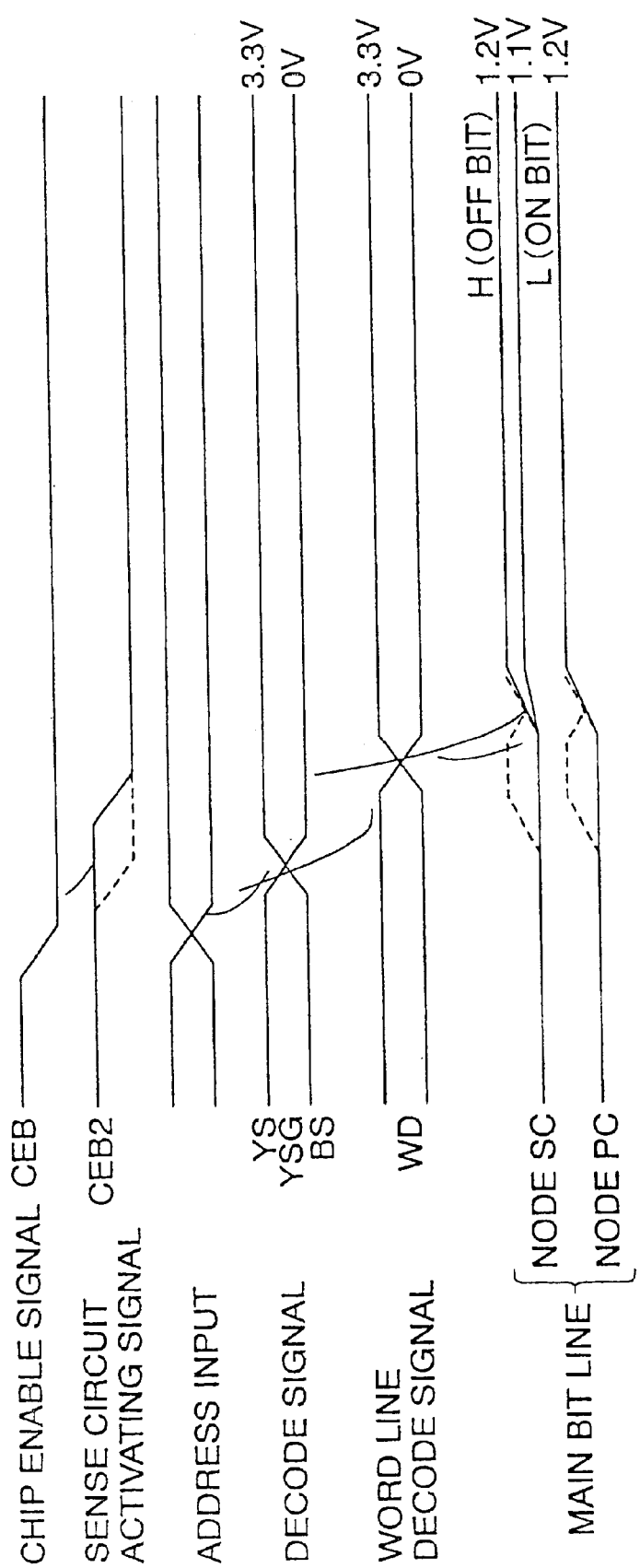
FIG. 11 is a timing chart showing the operation of the semiconductor memory device according to the first embodiment of the present invention.

Next, the operation of the semiconductor memory device related to the first embodiment as explained in the above is described below. FIG. 11 is a timing chart showing the operation of the semiconductor memory device related to the first embodiment of the present invention. In FIG. 11, solid lines indicate the operation of the first embodiment and dotted lines indicate the operation of the conventional semiconductor memory device.

First, each of decoding signals YS, BS and YSG is activated by activation (low active) of a chip enable signal (control signal) CEB. A word line decoding signal WD is activated slightly later than the activation of the decoding signals. Concurrently with the activation of the word line decoding signal WD, the delay circuit 301 delays the chip enable signal CEB and outputs it to the sense circuit 109 as an activating signal CEB2. When the sense circuit 109 is activated, the main bit line (node SC) is activated. At this time, the main bit line (node SC) is activated in a timing almost same as that of the decoding signal WD. Accordingly, steep voltage drop of the main bit line directly after the activation of word lines can be avoided.

Figure 12:
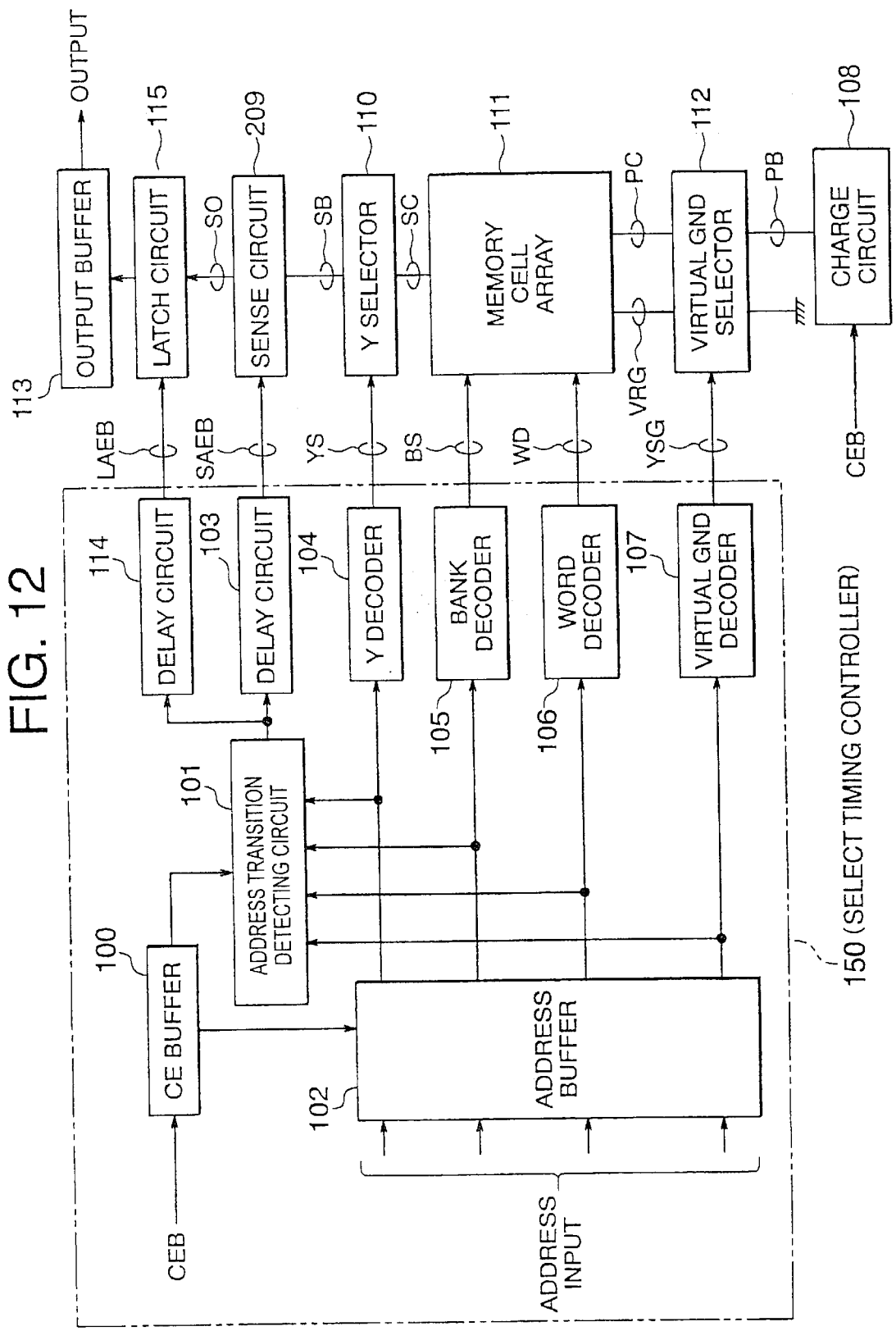
FIG. 12 is a block diagram showing the semiconductor memory device according to a second embodiment of the present invention.

Next, a second embodiment of the present invention will be described. FIG. 12 is a block diagram showing a semiconductor memory device related to the second embodiment of the present invention. In the second embodiment, same reference numerals are used to indicate the constituents same with those of the first embodiment and are not explained in detail.

In the second embodiment, there are provided with an address transition detecting circuit 101, delay circuits 103 and 114, a sense circuit 209, a charge circuit (main charge circuit) 208, a latch circuit 115 and the like. The sense circuit 209 is activated by a sense circuit activating signal SAEB. The sense circuit activating signal SAEB is outputted from the delay circuit 103. The latch circuit 115 is controlled by a latch control signal LAEB. The latch control signal LAEB is outputted from the delay circuit 114.

A select timing controller 150 may be composed of the CE buffer 100, the address transition detecting circuit 101, the address buffer 102, the delay circuits 103 and 114, the Y decoder 104, the bank decoder 105, the word decoder 106, and the virtual GND decoder 107.

Figure 13A:
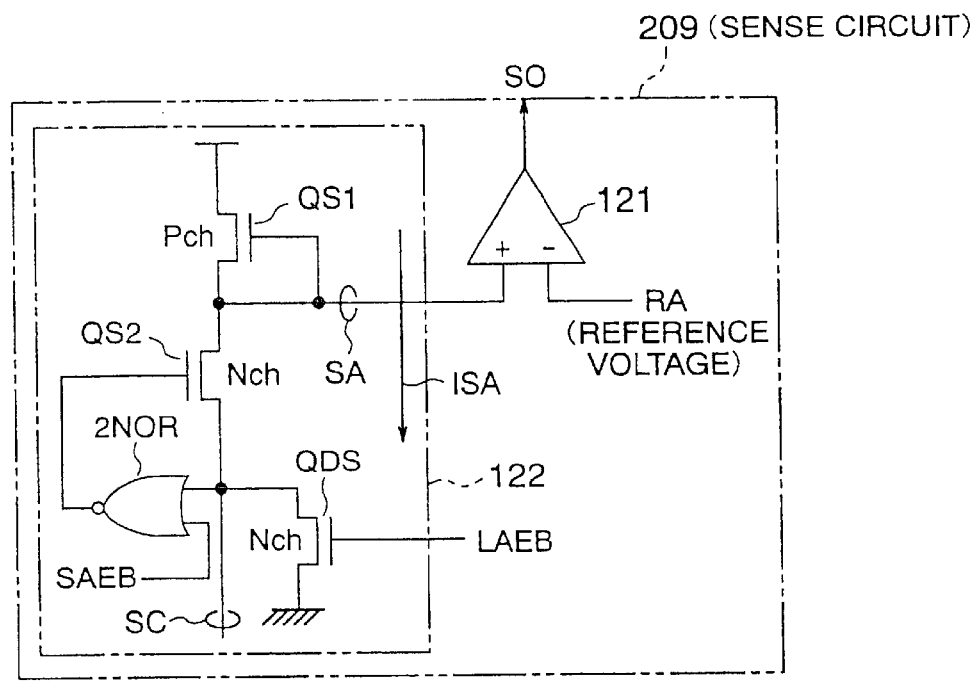
FIGS. 13A to 13C are block diagrams showing a series of sense circuits according to the second embodiment.
Figure 13B:
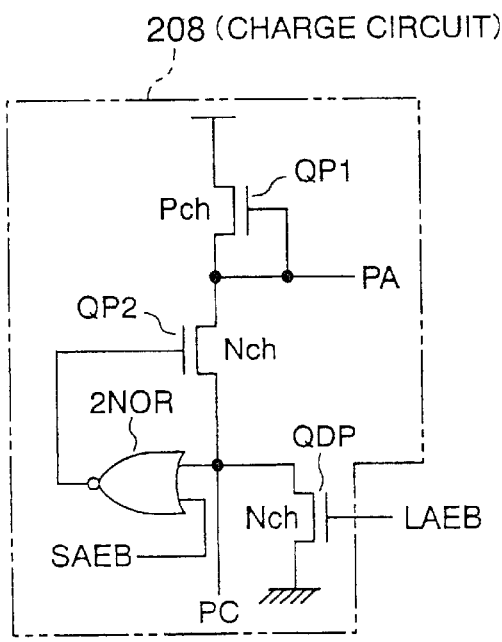
Figure 13C:
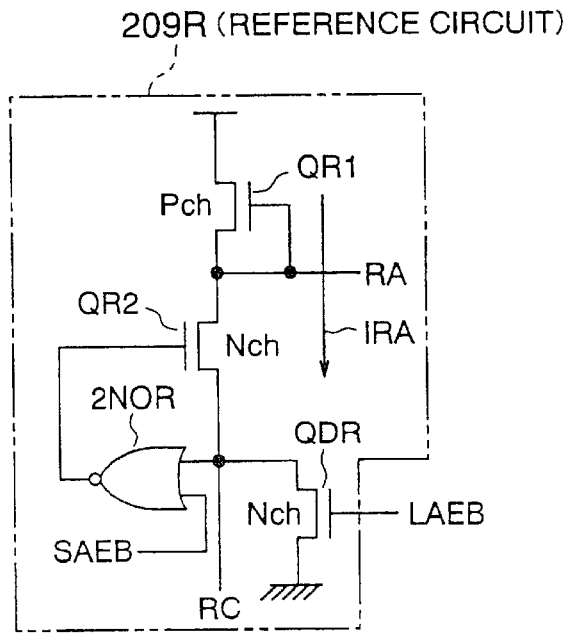

FIGS. 13A to 13C are block diagrams showing a series of sense circuits in the second embodiment. The sense circuit 209 and the charge circuit 208 have discharge transistors QDS and QDP for discharging main bit lines, respectively.

Next, the operation of the semiconductor memory device according to the second embodiment constructed as explained in the above is described, in particular in connection with a plural times of reading and coupling reaction between main bit lines. FIG. 14 is a timing chart showing the operation of the semiconductor memory device according to the second embodiment of the present invention.

In a first reading period, if the memory cell MC0 is selected, the main bit line D0 is selected, the main bit line D3 is connected to the charge circuit 208, and the main bit line D1 is set to OPEN. As a result, the sense circuit activating signal SAEB and the latch control signal LAEB are set to the low level. And, the sense circuit 209 and the charge circuit 208 are activated, so that the bit lines D0 and D3 are charged. In addition, an electric potential of node SC approaches to the logic threshold value of the OR gate 2NOR in the bias circuit 122 as shown in FIG. 13A. Also, the logic threshold values of the OR gates 2NOR in the bias circuit 122 and the charge circuit 208 are same. In this condition, if the sense circuit activating signal SAEB and the latch control signal LAEB are set to the high level, the latch circuit 115 latches an output signal SO of the sense circuit 209. Furthermore, by inactivating the sense circuit 209 and activating the discharge transistors QDS and QDP, electric charges which were charged in the main bit lines D0 and D3 are discharged, and the electric potentials of the main bit lines D0 and D3 are reset to the GND level.

If the memory cell MC4 is continuously selected in a second reading period, the main bit line D1 is selected and the main bit line D3 is connected to the virtual GND line. And, the charge circuit 208 is connected to the main bit line D2. At this time, both of the main bit lines D1 and D3 are maintained in the GND level, the selected main bit line D1 is smoothly charged and reaches to a balanced voltage.

According to the second embodiment, noises caused by cross talk between the main bit lines can be avoided at any reading periods, because the main bit lines are discharged to the GND level at every reading cycle. As a result, a charging speed of the selected main bit line is improved, thereby allowing high speed operation.

Figure 15:
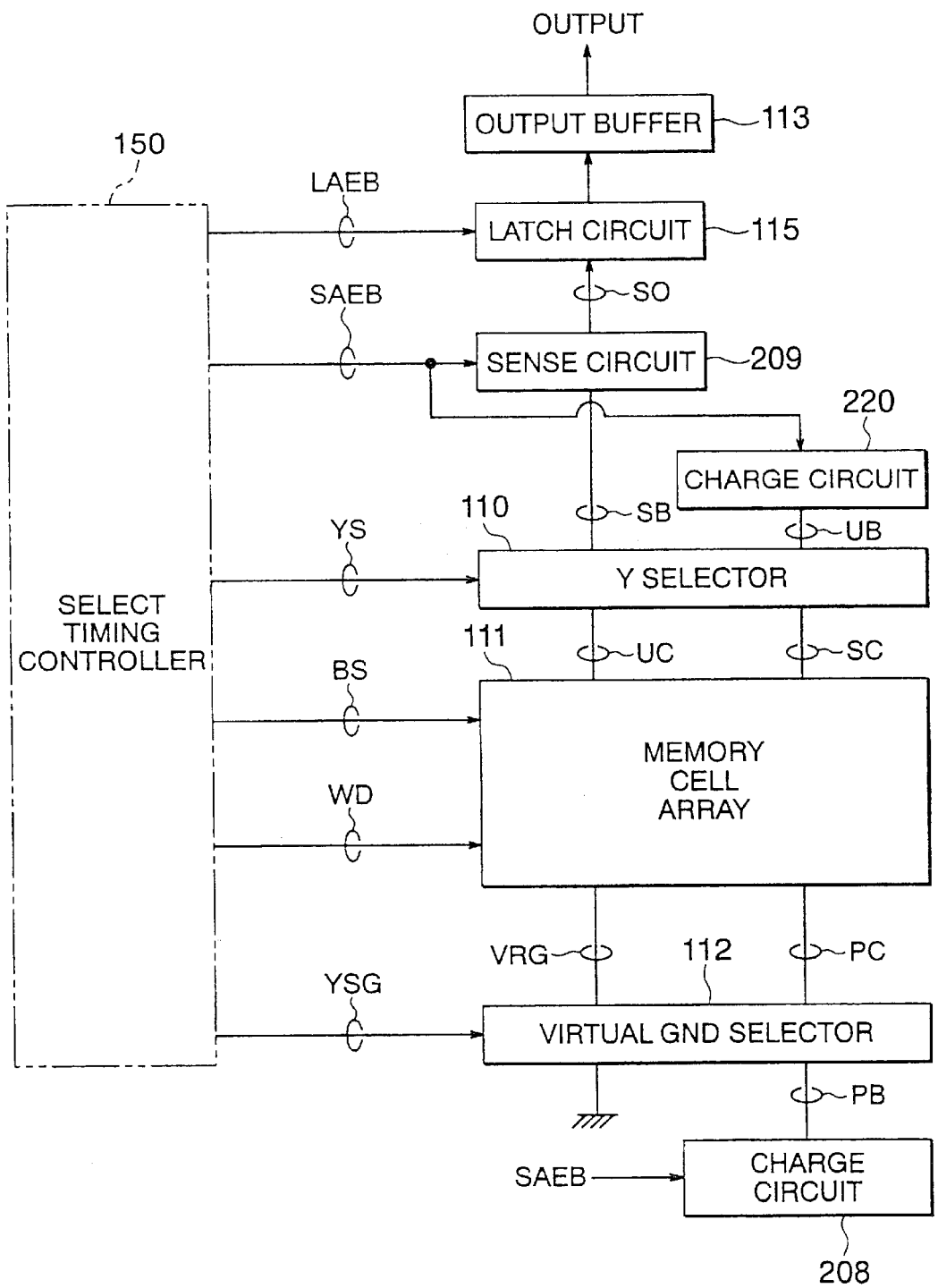
FIG. 15 is a block diagram showing the semiconductor memory device according to a third embodiment of the present invention.
Figure 16:
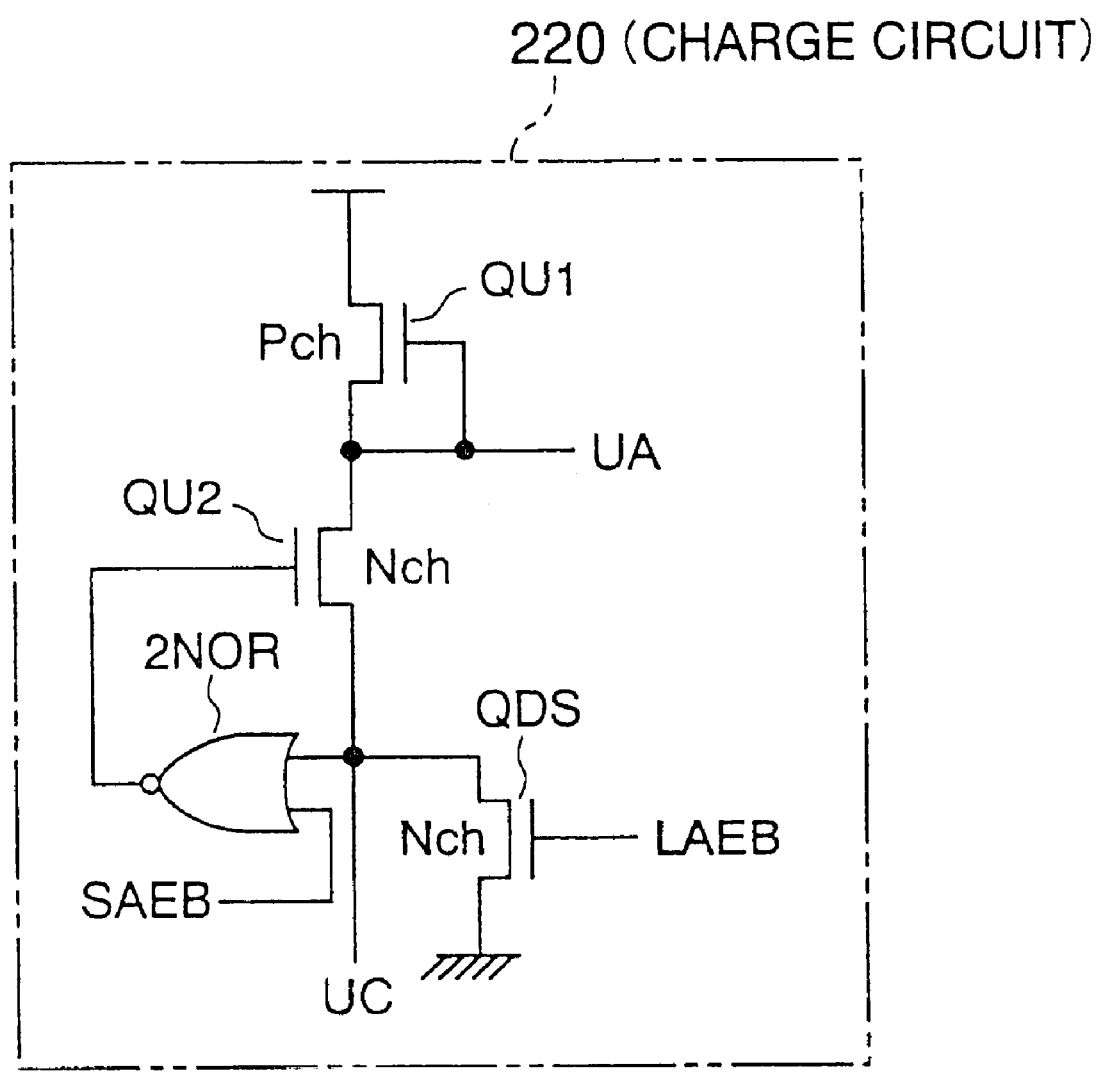
FIG. 16 is a block diagram showing a charge circuit in the third embodiment of the present invention.
Figure 17:
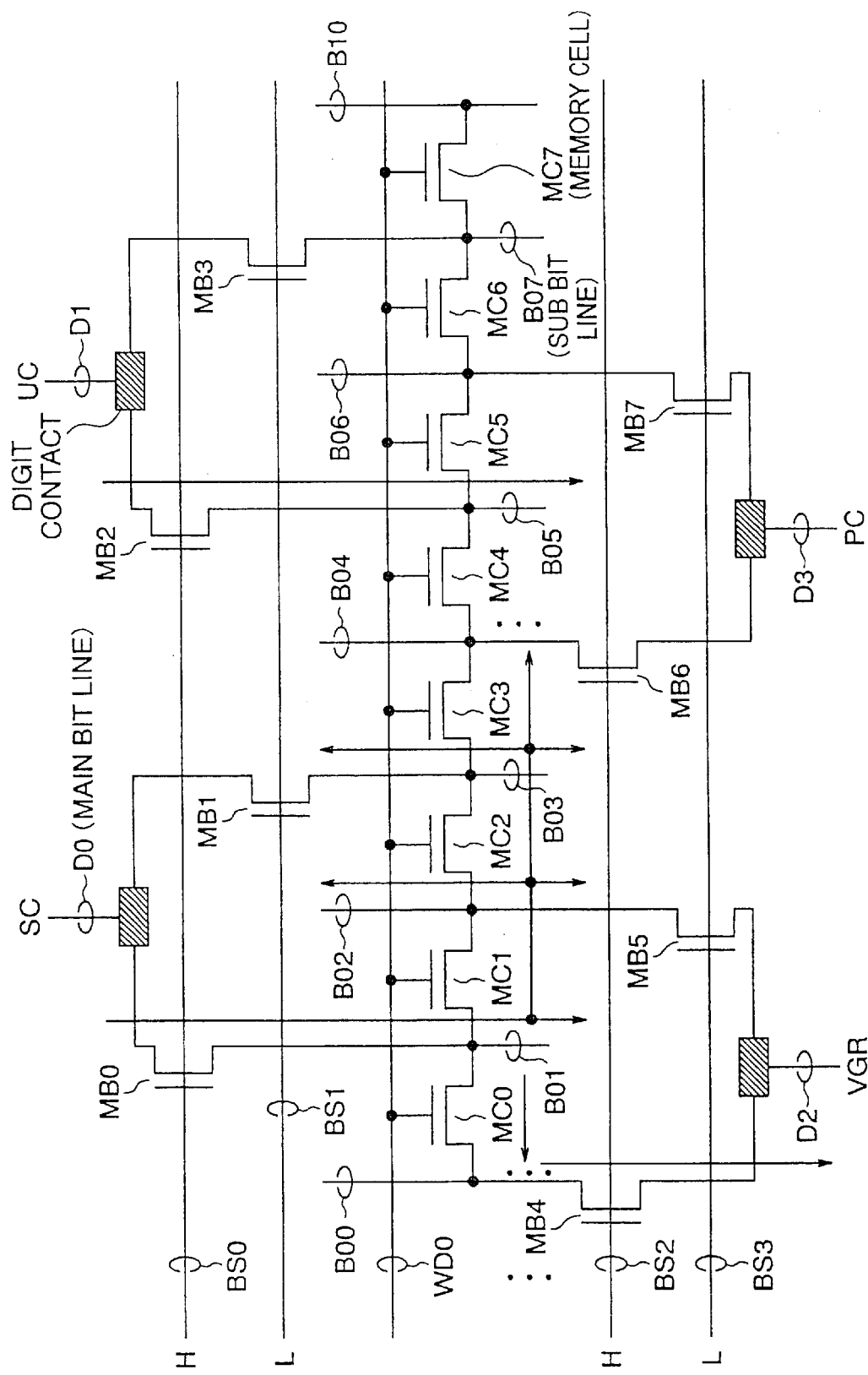
FIG. 17 is a circuit diagram showing banks in the third embodiment.

Next, a third embodiment of the present invention is described. FIG. 15 is a block diagram showing a semiconductor memory device according to the third embodiment of the present invention. FIG. 16 is a block diagram showing a charge circuit in the third embodiment. FIG. 17 is a circuit diagram showing banks according to the third embodiment. In the third embodiment, same reference numerals are used to indicate constituents same with those of the second embodiment and are not explained in detail.

In the third embodiment, there is provided with a charge circuit (sub-charge circuit) 220 in addition to the second embodiment. The charge circuit 220 charges a sub-bit line B05 by charging a node UC, when a memory cell MC0 shown in FIG. 17 is selected. As a result, the load capacity of the charge circuit 208 is reduced, so that the charging speed of the node PC can be improved. As shown in FIG. 16, the construction of the charge circuit 220 is identical or similar to the charge circuit 208. The charge circuit 220 is provided with, for example, a discharge transistor QDU.

In addition, the operation of the third embodiment is identical to that of the second embodiment. Therefore, the node UC shown in FIG. 17 can be reset to the GND level.

Figure 18:
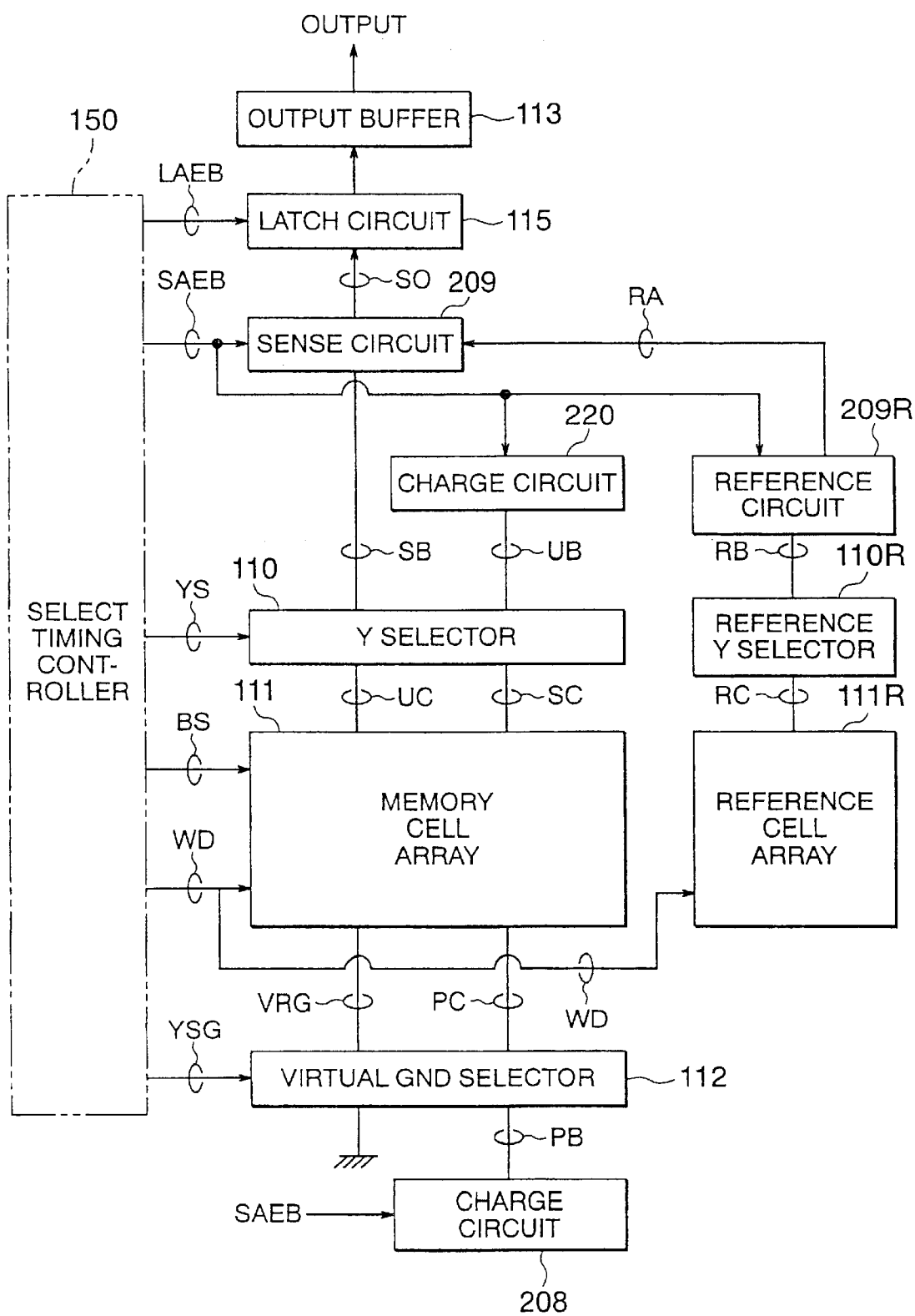
FIG. 18 is a block diagram showing the semiconductor memory device according to a fourth embodiment of the present invention.
Figure 19:
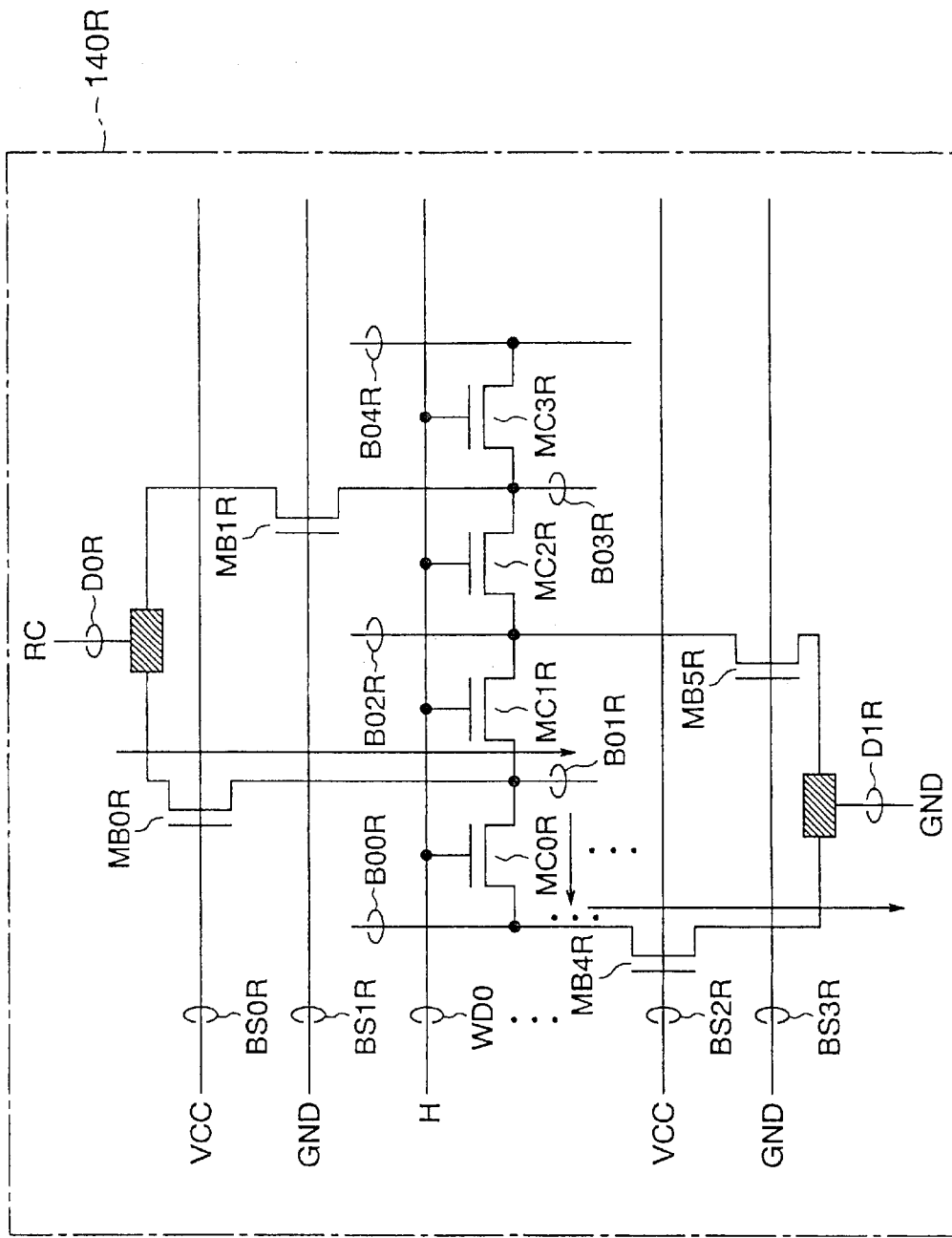
FIG. 19 is a circuit diagram showing a reference circuit in the fourth embodiment.
Figure 20:
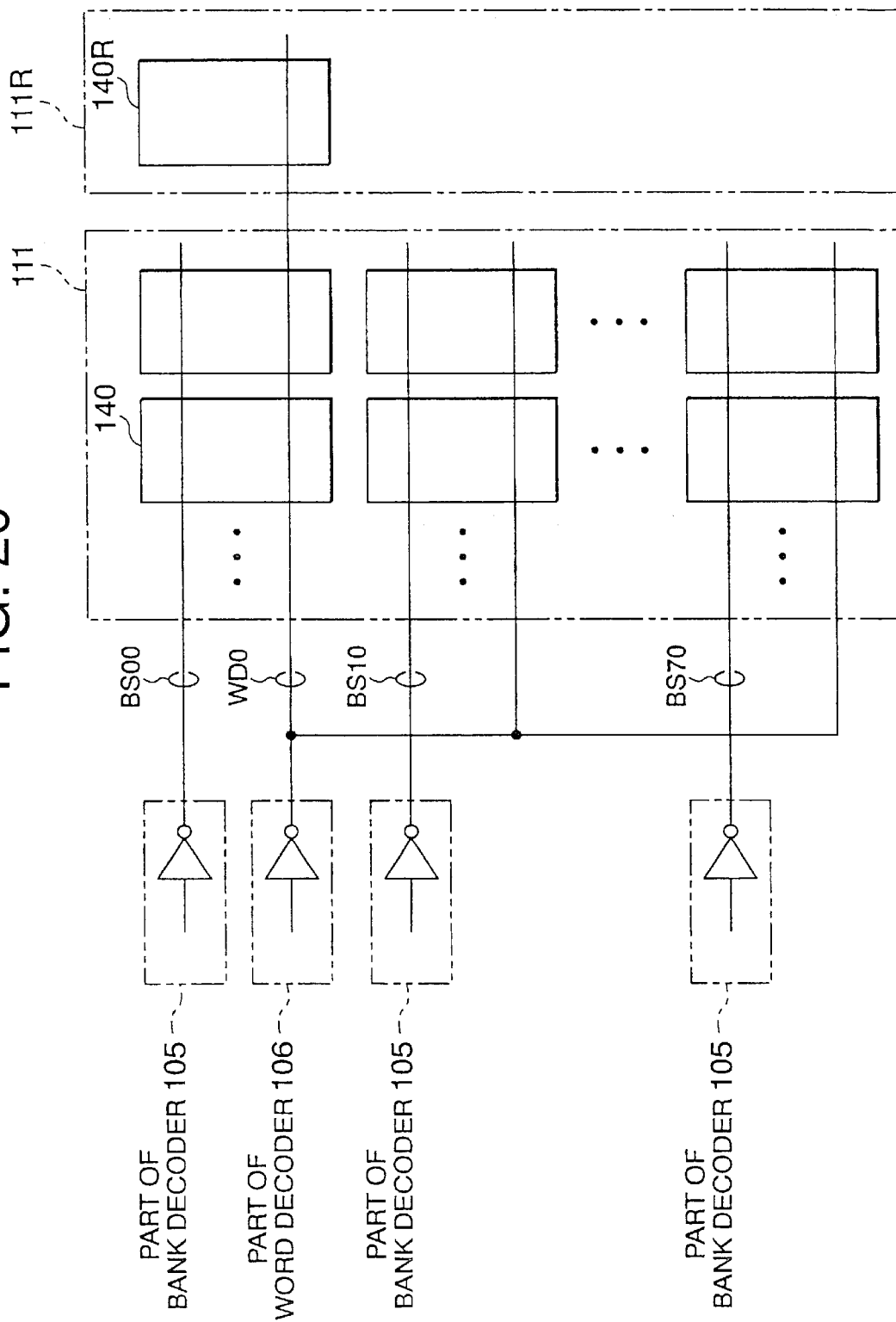
FIG. 20 is a circuit diagram showing banks in the fourth embodiment.

Next, a fourth embodiment of the present invention is described. FIG. 18 is a block diagram showing a semiconductor memory device according to the fourth embodiment of the present invention. FIG. 19 is a circuit diagram showing a reference circuit in the fourth embodiment. FIG. 20 is a circuit diagram showing banks in the fourth embodiment. In the fourth embodiment, same reference numerals are used to indicate constituents same with those of the third embodiment and are not explained in detail.

In the fourth embodiment, there are provided with a reference circuit 209R, a reference Y selector 110R, and a reference cell matrix 111R. FIG. 19 shows an example allowing to select a reference cell MC0R by a word line WD0. If A selecting signal of the reference Y selector 110R and a specific bank selecting line are fixed to the VCC or GND level, data can be read out.

If current capacity of the reference cell MC0R is designed to be identical to the memory cell MC0 (ON bit), the relationship, VSA (ON)<VRA<VSA (OFF) can be satisfied hen Wqr1=2×Wqs1. Wqr1 is a channel width of transistor QR1 (in the reference circuit 209R shown in FIG. 13C), Wqs1 is a channel width of transistor QS1 (in the sense circuit 209 shown in FIG. 13A), VSA (OFF) is a voltage of the node SA when selecting OFF bit, VSA (ON) is a voltage of the node SA when selecting ON bit, and IRA is the voltage of the node RA. Also, the discharge transistor QDR is also provided in the reference circuit 209R. In order to prevent multiple selections of the reference cell, it is preferable to design the reference cell matrix 111R as shown in FIG. 20, for example.

According to the fourth embodiment, it is possible to reset nodes SC, PC, UC and RC to the GND level. The reference level VRA can be designed even if it is a fixed voltage. In this manner, by operating the reference cell and the reference circuit synchronously with the memory cell and the sense circuit, noise margin may be improved.

Figure 21:
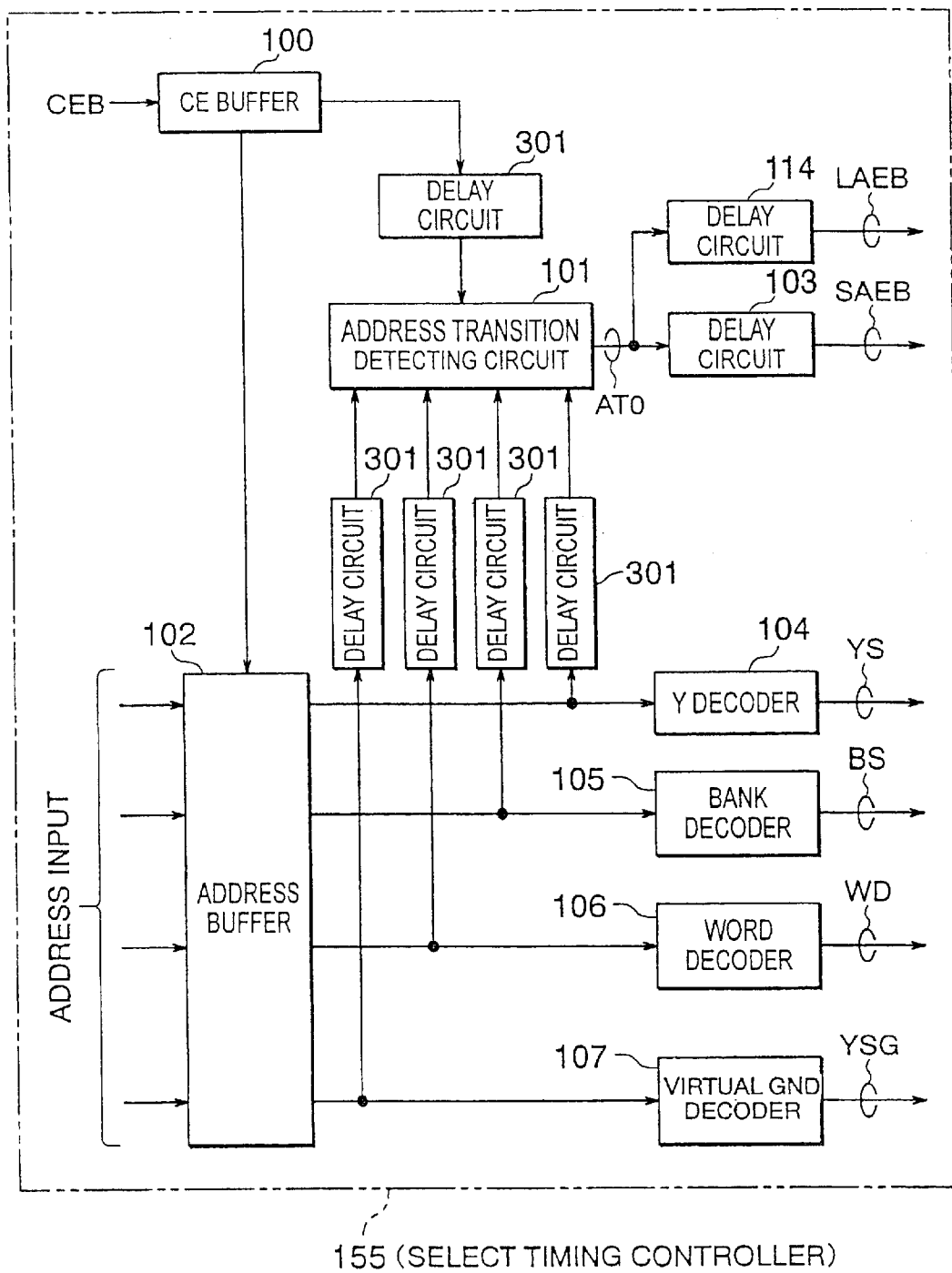
FIG. 21 is a block diagram showing the semiconductor memory device according to a fifth embodiment of the present invention.

Next, a fifth embodiment of the present invention is described. FIG. 21 is a block diagram showing a semiconductor memory device according to the fifth embodiment of the present invention. In the fifth embodiment, same reference numerals are used to indicate constituents same with those of the second embodiment and are not explained in detail.

In the fifth embodiment, there is provided with a select timing controller 155, instead of the select timing controller 150 in the second embodiment. Specifically, a delay circuit 301 is provided at the input side of the address transition detecting circuit 101. The delay circuit 301 is provided in order to approach the timing for activating the sense circuit to the timing for activating the word line as in the first embodiment.

The delay circuit 301 may be substituted by the delay circuit 302 shown in FIG. 6B. In this case, the output delay time of the CE buffer 100 is more increased. This adjusts the timing for activating the sense circuit not to be so fast, because the output of the CE buffer is faster than that of the address buffer 102. Further, it is possible to omit the delay circuit 301 to simplify the construction.

The semiconductor memory device according to the present invention is not limited to a mask ROM and is applicable to all of semiconductor read only memories which include a plurality of memory cells arranged in an array pattern, such as EPROM and EEPROM. In addition, the construction of the memory cell array is not limited to a specific one and may be same as that of shown in FIG. 22. Furthermore, the memory cells may be provided at each of intersections between main bit lines and sub-bit lines one by one.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. A semiconductor memory device comprising:
   a memory cell array, said memory cell array having: a plurality of main bit lines and a plurality of word lines which are perpendicularly intersected each other; and a plurality of memory cells provided at each of intersections between said main bit lines and word lines;
   a sense circuit which activates said main bit lines;
   a buffer which generates an activating signal which activates said sense circuit from a control signal;
   an address designating section which selects a memory cell indicated by an address signal among said plurality of memory cells, said address designating section activating a word line to which the memory cell indicated by said address signal is connected after some delay from the activation of a chip enable signal; and
   a delay circuit which delays said activating signal and outputting it to said sense circuit.

2. The semiconductor memory device according to claim 1, further comprising a data output section which outputs a signal in accordance with data stored in the memory cell selected by said address designating section, said sense circuit being included in said data output section.

3. The semiconductor memory device according to claim 2, wherein said data output section comprises a main charge circuit which resets said main bit lines to the GND level based on said activating signal.

4. The semiconductor memory device according to claim 1, wherein said memory cell array has flat type structure and said semiconductor memory device is a mask ROM.

5. A semiconductor memory device comprising:

a memory cell array, said memory cell array having: a plurality of sub-bit lines and a plurality of word lines which are perpendicularly intersected each other; a plurality of memory cells provided at each of intersections between said sub-bit lines and word lines; and a plurality of main bit lines to each of which two sub-bit lines among said plurality of sub-bit lines are commonly connected, one main bit line being disposed between said two sub-bit lines;

a sense circuit which activates said main bit lines;

a buffer which generates an activating signal which activates said sense circuit from a control signal;

an address designating section which selects a memory cell indicated by an address signal among said plurality of memory cells, said address designating section activating a word line to which the memory cell indicated by said address signal is connected after some delay from the activation of a chip enable signal; and a delay circuit which delays said activating signal and outputting it to said sense circuit.

6. The semiconductor memory device according to claim 5, further comprising a data output section which outputs a signal in accordance with data stored in the memory cell selected by said address designating section, said sense circuit being included in said data output section.

7. The semiconductor memory device according to claim 6, wherein said data output section comprises a sub-charge circuit which charges said sub-bit lines based on said activating signal.

8. The semiconductor memory device according to claim 7, wherein said data output section comprises a main charge circuit which resets said main bit lines to the GND level based on said activating signal.

9. The semiconductor memory device according to claim 7, wherein said data output section comprises a reference circuit which outputs a reference voltage for determining data of said memory cell, said reference circuit being operated synchronously with sense circuit based on said activating signal.

10. The semiconductor memory device according to claim 6, wherein said data output section comprises a main charge circuit which resets said main bit lines to the GND level based on said activating signal.

11. The semiconductor memory device according to claim 10, wherein said data output section comprises a reference circuit which outputs a reference voltage for determining data of said memory cell, said reference circuit being operated synchronously with sense circuit based on said activating signal.

12. The semiconductor memory device according to claim 6, wherein said data output section comprises a reference circuit which outputs a reference voltage for determining data of said memory cell, said reference circuit being operated synchronously with sense circuit based on said activating signal.

13. The semiconductor memory device according to claim 5, wherein said memory cell array has flat type structure and said semiconductor memory device is a mask ROM.

* * * * *